United States Patent
Lee et al.

(10) Patent No.: US 7,211,484 B2
(45) Date of Patent: May 1, 2007

(54) METHOD OF MANUFACTURING FLASH MEMORY DEVICE

(75) Inventors: Seung Cheol Lee, Icheon-si (KR); Sang Wook Park, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/745,008

(22) Filed: Dec. 23, 2003

(65) Prior Publication Data
US 2005/0106822 A1   May 19, 2005

(30) Foreign Application Priority Data
Nov. 19, 2003   (KR)   ............. 10-2003-0081960

(51) Int. Cl.
*H01L 21/336*   (2006.01)
*H01L 21/8242*  (2006.01)
*C09K 13/00*    (2006.01)

(52) U.S. Cl. ............ 438/257; 438/259; 438/264; 252/79.1

(58) Field of Classification Search ......... 438/257, 438/265, 267, 295, 303, 589, 596, 745, 694, 438/906, 942, 948; 252/79.1, 79.4
See application file for complete search history.

(56) References Cited

U.S. PATENT DOCUMENTS

| | | | |
|---|---|---|---|
| 5,872,060 A * | 2/1999 | Ashigaki et al. ........... 438/697 |
| 6,355,524 B1 * | 3/2002 | Tuan et al. ............... 438/257 |
| 6,479,411 B1 * | 11/2002 | Hui et al. ................ 438/712 |
| 6,562,681 B2 * | 5/2003 | Tuan et al. ............... 438/257 |
| 6,703,319 B1 * | 3/2004 | Yates et al. .............. 438/745 |
| 6,743,675 B2 * | 6/2004 | Ding .................... 438/257 |
| 6,759,708 B2 * | 7/2004 | Hurley et al. ............. 257/315 |
| 6,808,989 B2 * | 10/2004 | Hurley et al. ............. 438/264 |
| 6,884,682 B2 * | 4/2005 | Lee ..................... 438/258 |

FOREIGN PATENT DOCUMENTS

JP    1999-0156650    *  4/1997

* cited by examiner

Primary Examiner—Long Pham
Assistant Examiner—Shrininvas H. Rao
(74) Attorney, Agent, or Firm—Marshall, Gerstein & Borun

(57) ABSTRACT

Disclosed is a method of manufacturing a flash memory device. In a flash memory device using a SA-STI scheme, a trench for isolation is buried with oxide. A field oxide film is then formed by means of a polishing process. Next, field oxide films of a cell region and a low-voltage transistor region are selectively etched by a given thickness. As EFH values of the cell region, the low-voltage transistor region and the high-voltage transistor region become same or similar, it is possible to secure stability of a subsequent process.

21 Claims, 6 Drawing Sheets

METHOD OF MANUFACTURING FLASH MEMORY DEVICE

BACKGROUND

1. Field of the Invention

The present invention relates to a method of manufacturing a flash memory device and, more specifically, to a method of manufacturing a flash memory device that can improve effective field oxide height (hereinafter, referred to as "EFH") variation between a cell region, a high-voltage transistor region and a low-voltage transistor region in a flash memory device using a self-aligned shallow trench isolation (hereinafter, referred to as "SA-STI") scheme.

2. Discussion of Related Art

A flash memory is provided with a high-voltage transistor and a low-voltage transistor for driving cells in view of a device's characteristic. A gate oxide film of the high-voltage transistor has a thick thickness, a gate oxide film of the low-voltage transistor has a thin thickness, and a gate oxide film of the cell has the same or similar thickness as those of the low-voltage transistor. For example, in a 120 nm level NAND flash memory device, the gate oxide film in the cell may be about 80 Å in thickness, the gate oxide film in the high-voltage transistor may be 350 Å in thickness, and the gate oxide film in the low-voltage transistor may be about 80 Å in thickness. A difference in a topology depending on the thickness of the oxide film in each region results in EFH variation between the high-voltage transistor region and the cell region or the low-voltage transistor region after a chemical mechanical polishing (hereinafter, referred to as "CMP") process for performing a field oxide film, a subsequent process, is performed. In the above, EFH refers to an effective height of a field oxide film that is protruded upwardly from the interface between a first polysilicon layer for a floating gate and a second polysilicon layer for a floating gate.

FIG. 1 is a cross-sectional view illustrating a method of manufacturing a flash memory device using the SA-STI scheme according to a related art.

Referring to FIG. 1, a semiconductor substrate 11 in which a cell region CELL, a high-voltage transistor region HV and a low-voltage transistor region LV are defined is provided. A high-voltage gate oxide film 12H is thickly formed on the semiconductor substrate 11 of the high-voltage transistor region HV, and a low-voltage gate oxide film 12L and a cell gate oxide film 12C are thinly formed on the semiconductor substrate 11 of each of the low-voltage transistor region LV and the cell region CELL. A first polysilicon layer 13 for a floating gate is formed on the oxide films 12C, 12H and 12L. A SA-STI process is then performed to form a number of trenches 15 for isolation in the semiconductor substrate 11. The trenches 15 are buried with oxide for isolation to form field oxide films 160. A second polysilicon layer 17 for a floating gate is then formed on the entire structure including the field oxide films 160. Though not shown in the drawing, an etch process using a mask for a floating gate, a dielectric film formation process, a process of forming a conductive layer for a control gate, and an etch process using a mask for a control gate are performed to form gates in the respective regions CELL, HV and LV.

If the flash memory device is fabricated by the above-mentioned method, however, EFH variation takes place among the field oxide films 160 each formed in the regions CELL, HV and LV due to a difference in a topology of the oxide films 12C, 12H and 12L, which are formed in the cell region CELL, the high-voltage transistor region HV and the low-voltage transistor region LV, respectively. It results in EFH variation of about 300 Å or more, even if a nitride film strip process that is used in a SA-STI process after a CMP process and a cleaning process that is performed before the second polysilicon layer 17 is deposited are performed. The EFH of the field oxide film 160 in the high-voltage transistor region HV is about 50 to 200 Å, while the EFH of the field oxide film 160 in the cell region CELL or the low-voltage transistor region LV is 300 to 800 Å. The EFH of the cell region CELL and the low-voltage transistor region LV are high and wide in value. Such values vary depending on conditions of the CMP process. Variation in the EFH between the high-voltage transistor region HV and other regions CELL and LV not only causes many problems such as making it difficult to set a gate etch target of each of the regions CELL, HV and LV, making it impossible to obtain a good gate pattern profile, causing a fail in a device due to polysilicon remnant, and the like. These problems become critical, as the devices is higher integrated. An attempt to solve these problems has been made.

SUMMARY OF THE INVENTION

The present invention is directed to a method of manufacturing a flash memory device, which can secure stability of a process and reliability of a device, by improving EFH variation that is caused among a cell region, a high-voltage transistor region and a low-voltage transistor region due to a protrusion of a field oxide film of each of the regions.

According to a preferred embodiment of the present invention, there is provided a method of manufacturing a flash memory device, including the steps of providing a semiconductor substrate in which a cell region, a high-voltage transistor region and a low-voltage transistor region are defined; forming a field oxide film having a high EFH in the semiconductor substrate of each of the cell region and the low-voltage transistor region and forming a field oxide film having a low EFH in the semiconductor substrate of the high-voltage transistor region, due to variation in a topology of the gate oxide films formed in the respective regions; and etching the field oxide films having the high EFH by a given thickness by means of a field oxide film recess process, whereby the EFHs of the field oxide films formed in the regions become same or similar.

According to another preferred embodiment of the present invention, there is provided a method of manufacturing a flash memory device, including the steps of forming a cell gate oxide film, a high-voltage gate oxide film and a low-voltage gate oxide film on a semiconductor substrate in which a cell region, a high-voltage transistor region and a low-voltage transistor region are defined; forming a first polysilicon layer and a nitride film on the gate oxide films; sequentially etching the nitride film, the first polysilicon layer, the gate oxide films and the semiconductor substrate to form a number of trenches for isolation in the respective regions; depositing an oxide film on the entire structure including the trenches, and then polishing the oxide film and the nitride film by a given thickness by means of a polishing process, whereby a field oxide film having a high EFH is formed in the semiconductor substrate of each of the cell region and the low-voltage transistor region and a field oxide film having a low EFH is formed in the semiconductor substrate of the high-voltage transistor region; stripping the nitride film left after the polishing process; etching the field oxide films having the high EFH by a given thickness by means of a field oxide film recess process, whereby the EHFs of the field oxide films formed in the regions become same or similar; and forming a second polysilicon layer on the first polysilicon layer including the field oxide films having the same or similar EFH.

According to still another preferred embodiment of the present invention, there is provided a method of manufacturing a flash memory device, including the steps of forming a cell gate oxide film, a high-voltage gate oxide film and a low-voltage gate oxide film on a semiconductor substrate in which a cell region, a high-voltage transistor region and a low-voltage transistor region are defined; forming a first polysilicon layer and a nitride film on the gate oxide films; sequentially etching the nitride film, the first polysilicon layer, the gate oxide films and the semiconductor substrate to form a number of trenches for isolation in the respective regions; depositing an oxide film on the entire structure including the trenches and then polishing the oxide film and the nitride film by a given thickness by means of a polishing process, whereby a field oxide film having a high EFH is formed in the semiconductor substrate of each of the cell region and the low-voltage transistor region and a field oxide film having a low EFH is formed in the semiconductor substrate of the high-voltage transistor region; etching the field oxide films having the high EFH by a given thickness by means of a field oxide film recess process, whereby the EHFs of the field oxide films formed in the regions become same or similar; stripping the nitride film left after the polishing process and the field oxide film recess process; and forming a second polysilicon layer on the first polysilicon layer including the field oxide films having the same or similar EFH.

In the above embodiments, the field oxide film recess process includes the steps of forming a photoresist pattern that closes the high-voltage transistor region in which the field oxide films having the low EFH are formed; etching the field oxide film having the high EFH by a given thickness using a BOE solution, by using the photoresist pattern as an etch mask; stripping the photoresist pattern and organic contaminant using a PIRANHA cleaning solution; and stripping particles and organic contaminant using a SC-1 cleaning solution. In this case, the photoresist pattern is hardened by means of a descum process at a temperature of 80 to 140° C. The BOE solution is a solution in which NH$_4$F and HF are mixed in the ratio of 9:1, 100:1 or 300:1. Further, a field oxide film etch target using the BOE solution is set according to variation in the EFH between the field oxide film having the low EFH and the field oxide film having the high EFH.

DETAILED DESCRIPTION OF PREFERRED EMBODIMENTS

Figure 1:
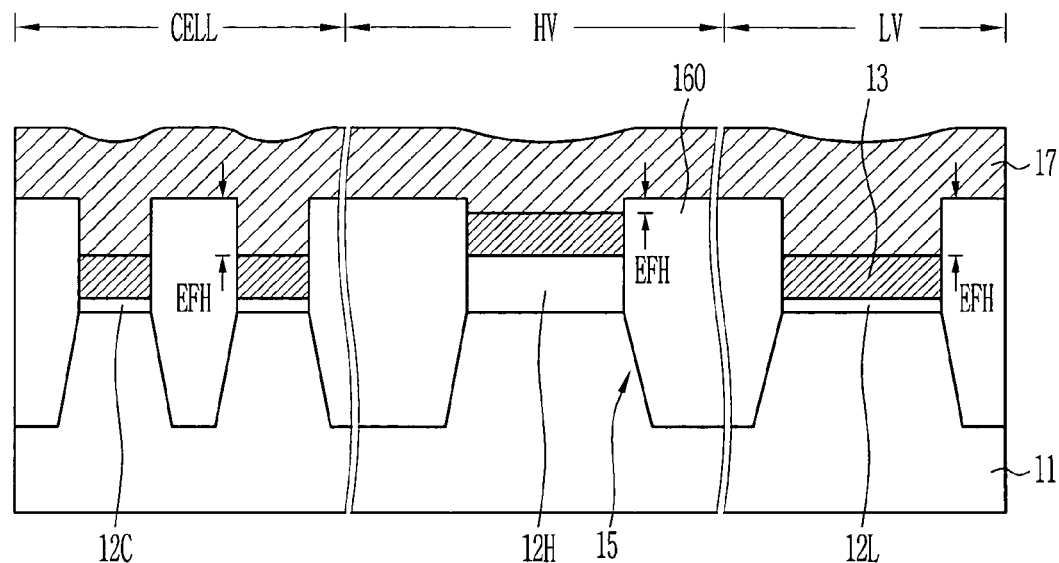
FIG. 1 is a cross-sectional view of a flash memory device for explaining a method of manufacturing the device according to a related art.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for convenience of explanation and clarity. Like reference numerals are used to identify the same or similar parts. Meanwhile, in case where it is described that one film is "on" the other film or a semiconductor substrate, the one film may directly contact the other film or the semiconductor substrate. Or, a third film may be intervened between the one film and the other film or the semiconductor substrate.

FIG. 2 to FIG. 6 are cross-sectional views of flash memory devices for explaining a method of manufacturing the device using a self align shallow trench isolation (SA-STI) scheme according to one embodiment of the present invention.

Figure 2:
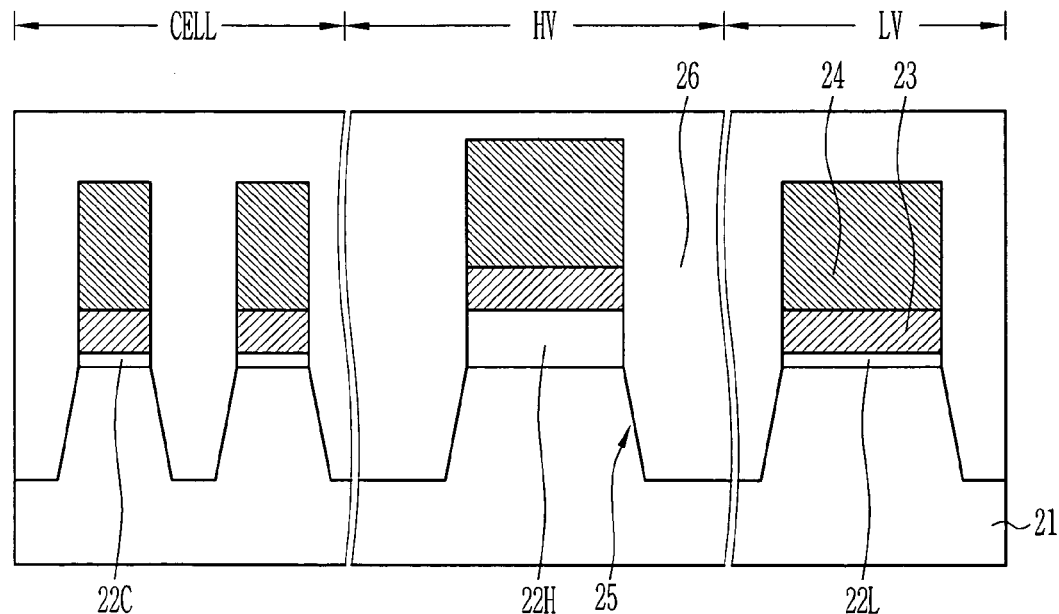
FIGS. 2 to 6 are cross-sectional views of flash memory devices for explaining a method of manufacturing the device according to one embodiment of the present invention.

Referring to FIG. 2, a semiconductor substrate 21 in which a cell region CELL, a high-voltage transistor region HV and a low-voltage transistor region LV are defined is provided. A high-voltage gate oxide film 22H is thickly formed on the semiconductor substrate 21 of the high-voltage transistor region HV. A low-voltage gate oxide film 22L and a cell gate oxide film 22C are thinly formed on the semiconductor substrates 21 of the low-voltage transistor region LV and the cell region CELL, respectively. A first polysilicon layer 23 for a floating gate is formed on the oxide films 22C, 22H and 22L. A nitride film 24 is formed on the first polysilicon layer 23. The nitride film 24, the first polysilicon layer 23, the oxide films 22C, 22H and 22L, and the semiconductor substrate 21 are then etched by means of a SA-STI etch process, thereby forming a number of trenches 25 for isolation in the semiconductor substrate 21 of the cell region CELL, the high-voltage transistor region HV and the low-voltage transistor region LV. Next, an oxide film 26 for isolation is formed on the entire structure including the trenches 25 for isolation, whereby the trenches 25 are sufficiently buried.

In the above, the high-voltage gate oxide film 22H is formed in a thickness of 300 to 500 Å, and the low-voltage gate oxide film 22L and the cell gate oxide film 22C are each formed in A thickness of below 100 Å. The first polysilicon layer 23 is formed in a thickness 300 to 700 Å. The nitride film 24 is formed in a thickness of 800 to 1200 Å. The trenches 25 are formed in depth of 2500 to 5000 Å. An oxide film 26 for isolation may be formed using a material having a good gap filing capability and a good insulating property, for example, HDP oxide, but may be formed in a single layer or a multi layer structure using various insulating substance.

Figure 3:
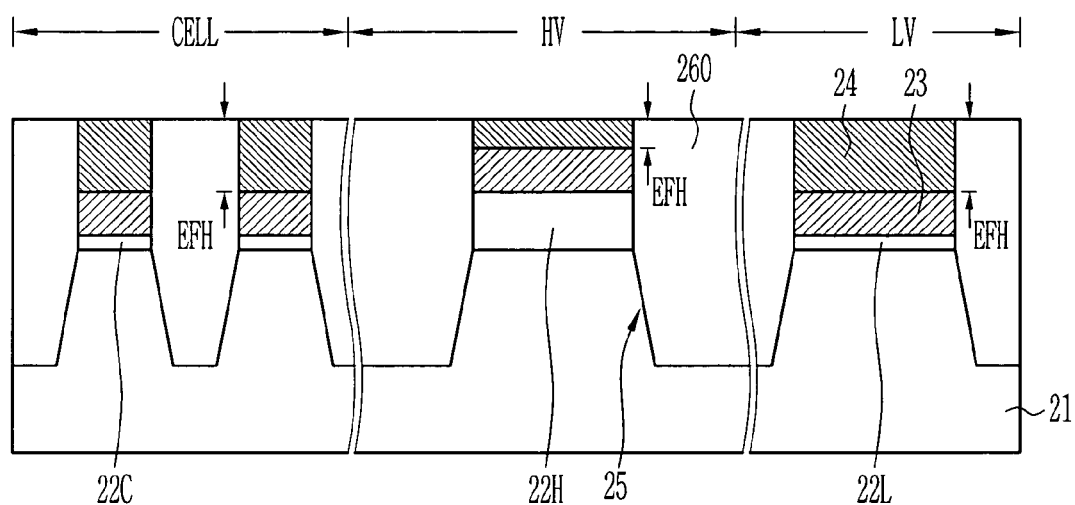

By reference to FIG. 3, a CMP process is performed to form field oxide films 260 within the trenches 25. In the above, it is preferred that the CMP process is performed right before the surface of the first polysilicon layer 23 in the high-voltage transistor region HV, which has a high topology due to the thick high-voltage gate oxide film 22H, is exposed.

From FIG. 3, it can be seen that the thickness of the nitride film 24 left in the cell region CELL or the low-voltage transistor region LV after the CMP process is much thicker than that of the nitride film 24 left in the high-voltage transistor region HV. The thickness of the nitride film 24 left in these regions CELL, HV and LV becomes a factor to decide an EFH value of each of the cell region CELL, the high-voltage transistor region HV and the low-voltage transistor region LV. In other words, the EFH value of the high-voltage transistor region HV is low, and the EFH value of each of the cell region CELL and the low-voltage transistor region LV is high. For this reason, there is variation in the EFH among these regions CELL, HV and LV. This causes the above-mentioned conventional problems to occur.

Figure 4:
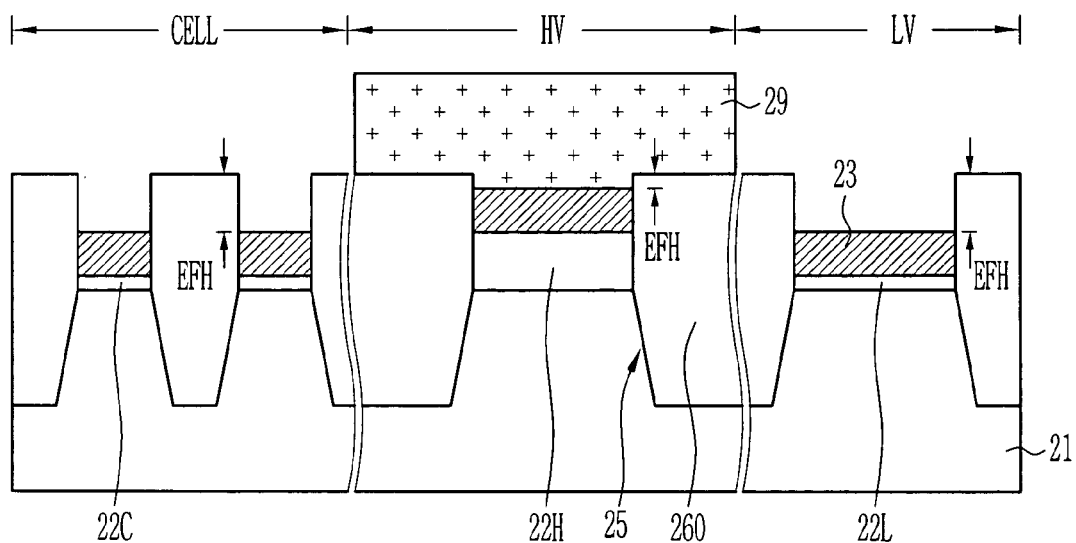

By reference to FIG. 4, the remaining nitride film 24 is pre-treated using an oxide etch solution containing HF and the remaining nitride film 24 is completely stripped in a solution containing $H_3PO_4$. During the HF pre-treatment process and the nitride film strip process, the top of the field oxide films 260 formed in respective regions CELL, HV and LV is lost a little. Due to this, although the EFH value of each of the regions CELL, HV and LV is a little lowered, variation in the EFH is not improved. A photoresist pattern 29 through which the high-voltage transistor region HV is closed and the cell region CELL and the low-voltage transistor region LV are opened, is formed on the field oxide film 260 and the first polysilicon layer 23 in the high-voltage region HV. In order to prevent the occurrence of attach on the substrate and defects due to a subsequent field oxide film recess process, the photoresist pattern 29 is hardened by means of a descum process. In this case, the descum process is performed at a temperature of 80 to 140° C. for 10 or less minutes.

Figure 5:
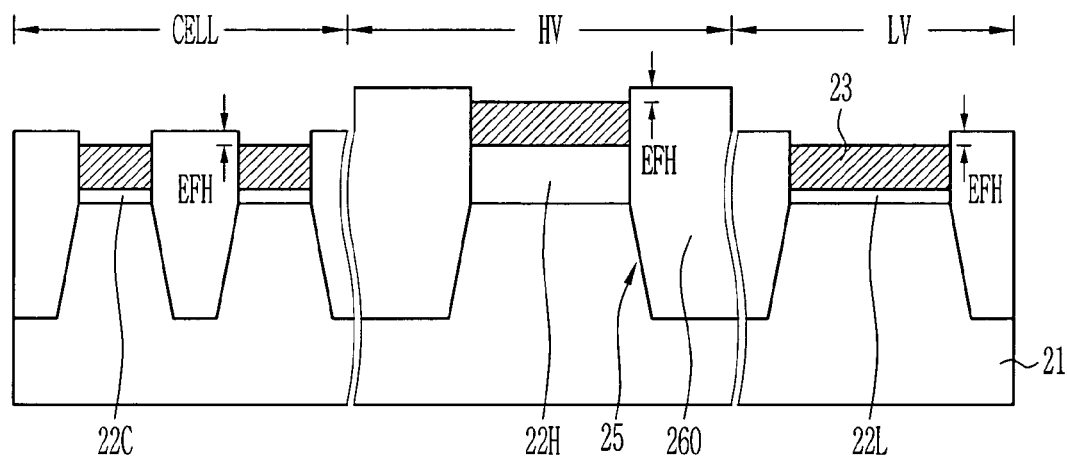

By reference to FIG. 5, the field oxide film 260 in each of the cell region CELL and the low-voltage transistor region LV is etched by a given thickness by means of a field oxide film recess process using the photoresist pattern 29 as an etch mask. This makes same or similar the protrusion and height of the field oxide film 260 in the high-voltage transistor HV that is protected by the photoresist pattern 29. While the field oxide film recess process is performed, the photoresist pattern 29 is stripped.

The field oxide film recess process may be performed by consecutively performing the following steps.

A first step includes etching the exposed portion of the field oxide film 260 by a given thickness by using a buffered oxide etchant (BOE) solution in which $NH_4F$ and HF are mixed in an adequate ratio, for example, 9:1, 100:1 or 300:1. At this time, if an EFH of the field oxide film 260 in the high-voltage transistor region HV has a value of 50 to 200 Å and an EFH of the field oxide film 260 in the cell region CELL or the low-voltage transistor region LV has a value of 300 to 800 Å, a field oxide film etch target is 200 to 600 Å. In other words, the field oxide film etch target is decided by variation in the EFH between the field oxide film 260 having a low EFH and the field oxide film 260 having a high EFH. Due to this, as shown in FIG. 5, the EFH of the field oxide film 260 in the cell region CELL and the low-voltage transistor region LV becomes same or similar as that of the field oxide film 260 in the high-voltage transistor HV.

A second step includes stripping the photoresist pattern 29 used as the etch mask while stripping organic contaminant generated in the process using the BOE solution in the first step, by using a PIRANHA cleaning solution where $H_2SO_4$ and $H_2O_2$ are mixed. At this time, a temperature of the PIRANHA cleaning solution is 80 to 130° C.

A third step includes maximizing stripping of particles and organic contaminant left after the PIRANHA cleaning process in the second step, by using standard cleaning-1 (SC-1) solution in which $NH_4OH$, $H_2O_2$ and $H_2O$ are mixed in an adequate ratio, for example, 1:1:5 or 0.2:1:10. At this time, a temperature of the SC-1 cleaning solution is 40 to 200° C.

Figure 6:
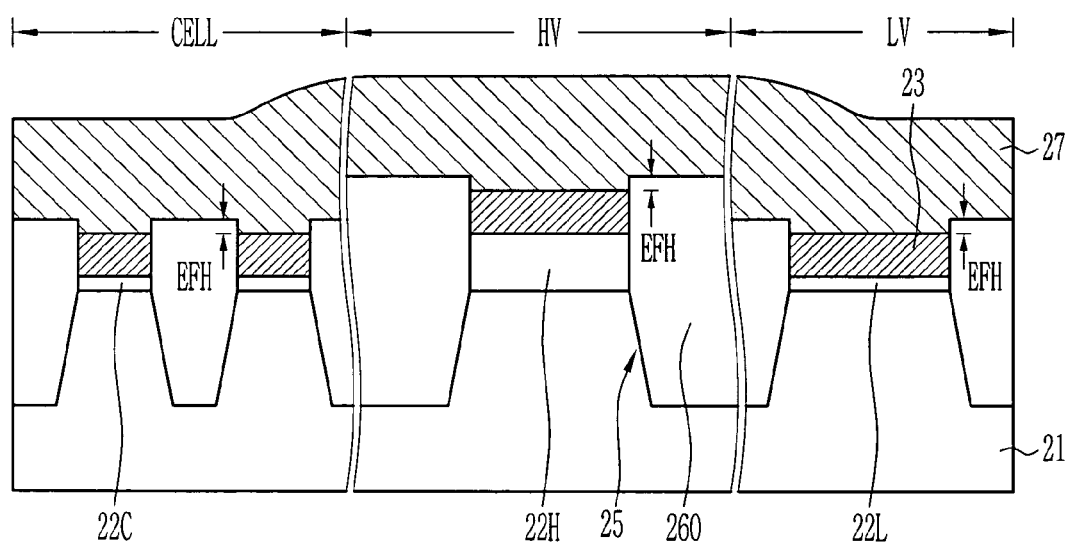

Referring to FIG. 6, a second polysilicon layer 27 for a floating gate is formed on the entire structure including the field oxide films 260 and the first polysilicon layer 23. Though not shown in FIG. 6, an etch process using a mask for a floating gate, a dielectric film formation process, a process of forming a conductive layer for a control gate, and an etch process using a mask for a control gate are performed to form gates in respective regions.

FIGS. 7 to 12 are cross-sectional views of flash memory devices for explaining a method of manufacturing the device using the SA-STI scheme according to another embodiment of the present invention.

Figure 7:
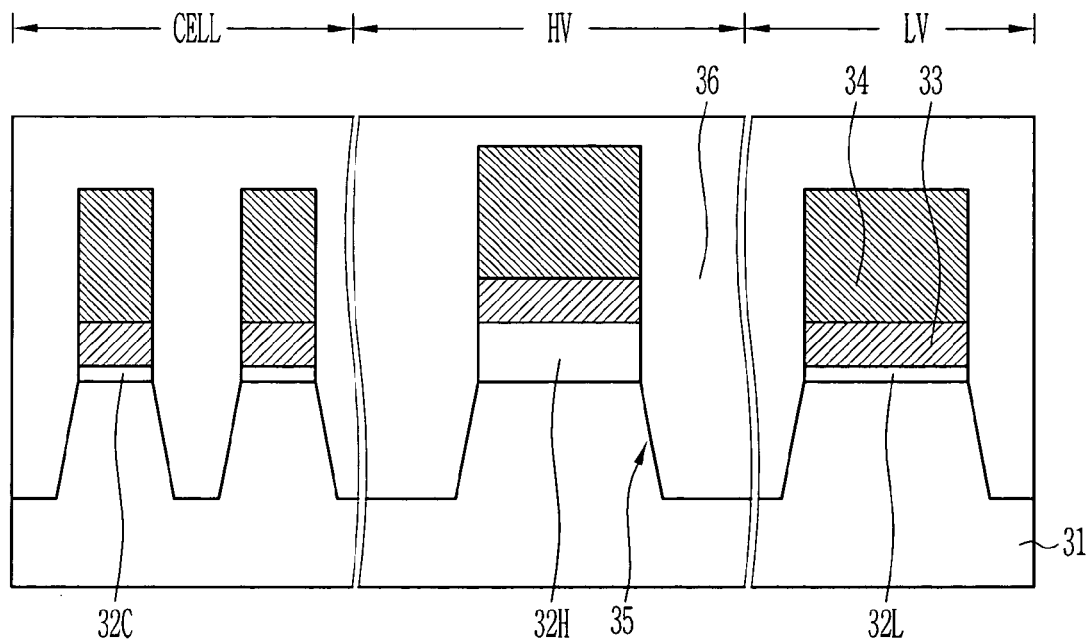
FIGS. 7 to 12 are cross-sectional views of flash memory devices for explaining a method of manufacturing the device according to another embodiment of the present invention.

Referring to FIG. 7, a semiconductor substrate 31 in which a cell region CELL, a high-voltage transistor region HV and a low-voltage transistor region LV are defined is provided. A high-voltage gate oxide film 32H is thickly formed on the semiconductor substrate 31 of the high-voltage transistor region HV. A low-voltage gate oxide film 32L and a cell gate oxide film 32C are thinly formed on the semiconductor substrates 31 of the low-voltage transistor region LV and the cell region CELL, respectively. A first polysilicon layer 33 for a floating gate is formed on the oxide films 32C, 32H and 32L. A nitride film 34 is formed on the first polysilicon layer 33. The nitride film 34, the first polysilicon layer 33, the oxide films 32C, 32H and 32L, and the semiconductor substrate 31 are etched by means of a SA-STI etch process, thereby forming a number of trenches 35 for isolation in the semiconductor substrate 31 of the cell region CELL, the high-voltage transistor region HV and the low-voltage transistor region LV. An oxide film 36 for isolation is then formed on the entire structure including the trenches 35 for isolation, so that the trenches 35 are sufficiently filled.

In the above, the high-voltage gate oxide film 32H is formed in thickness of 300 to 500 Å, and the low-voltage gate oxide film 32L and the cell gate oxide film 32C are each formed in thickness of below 100 Å. The first polysilicon layer 33 is formed 300 to 700 Å in thickness. The nitride film 34 is formed in thickness of 800 to 1200 Å. The trench 35 is formed in depth of 2500 to 5000 Å. The oxide film 36 for isolation may be formed using a material having a good gap filing capability and a good insulating property, for example, HDP oxide, but may be formed in a single layer or a multi layer structure using various insulating substance.

Figure 8:
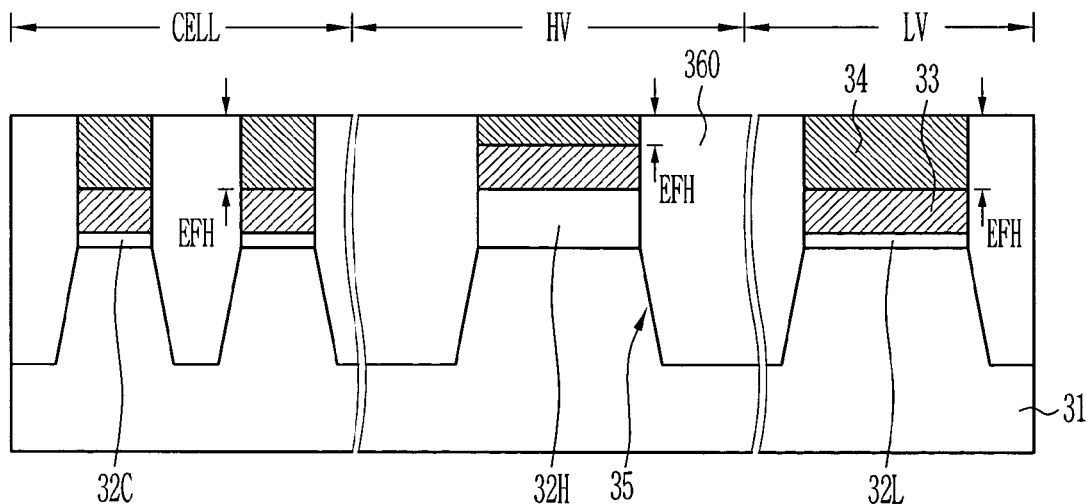

By reference to FIG. 8, a CMP process is performed to form field oxide films 360 within the trenches 35. At this time, it is preferred that the CMP process is performed right before the surface of the first polysilicon layer 33 in the high-voltage transistor region HV, which has a high topology due to a thick high-voltage gate oxide film 32H, is exposed.

From FIG. 8, it can be seen that a thickness of the nitride film 34 left in the cell region CELL or the low-voltage transistor region LV after the CMP process is much thicker than that of the nitride film 34 left in the high-voltage transistor region HV. The thickness of the nitride film 34 left in these regions CELL, HV and LV become a factor to decide the EFH value of each of the cell region CELL, the high-voltage transistor region HV and the low-voltage transistor region LV. In other words, the EFH value of the high-voltage transistor region HV is low and the EFH values of the cell region CELL and the low-voltage transistor region LV are high. For this reason, EFH variation occurs between these regions CELL, HV and LV. This causes the above-mentioned conventional problems to occur.

Figure 9:
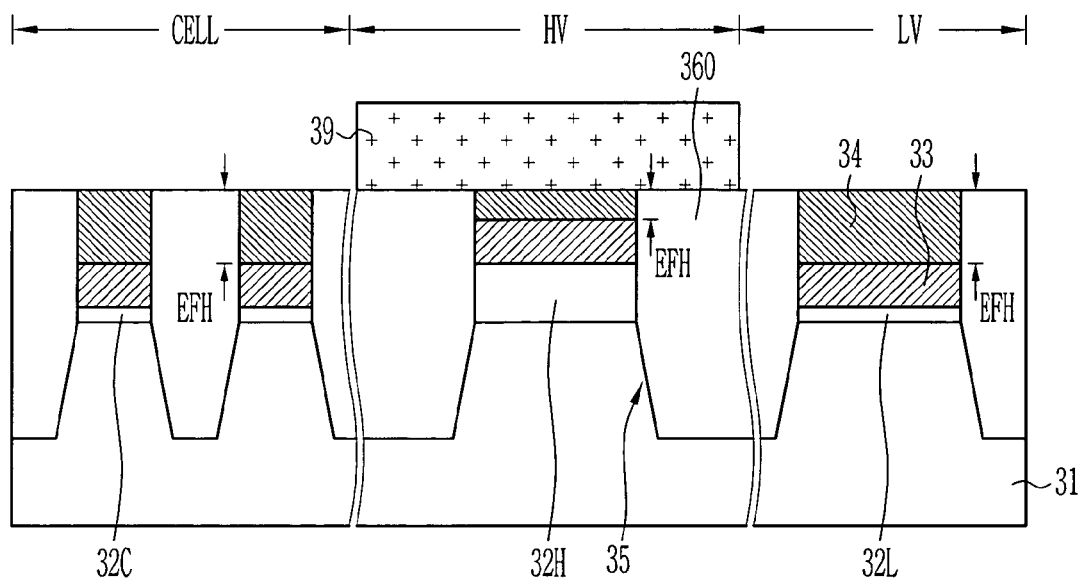

By reference to FIG. 9, a photoresist pattern 39 through which the high-voltage transistor region HV is closed and the cell region CELL and the low-voltage transistor region LV are opened is formed on the field oxide film 360 and the first polysilicon layer 33 in the high-voltage region HV. In order to prevent occurrence of attach against the substrate and defects due to a subsequent field oxide film recess process, the photoresist pattern 39 is hardened by means of a descum process. In this case, the descum process is performed at a temperature of 80 to 140° C. for 10 or less minutes.

Figure 10:
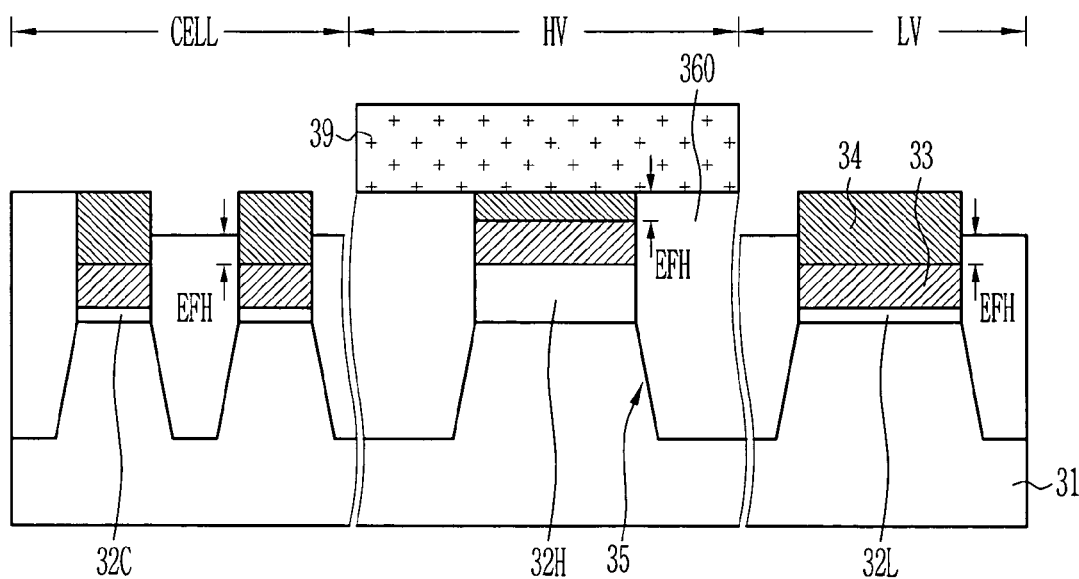

By reference to FIG. 10, the field oxide film 360 in each of the cell region CELL and the low-voltage transistor region LV is etched by a given thickness by means of a field oxide film recess process using the photoresist pattern 39 as an etch mask. This makes same or similar the protrusion and height of the field oxide film 360 in the high-voltage transistor HV that is protected by the photoresist pattern 39. During the field oxide film recess process, the photoresist pattern 39 is stripped.

The field oxide film recess process may be performed by continuously performing the following steps.

A first step includes etching the exposed portion of the field oxide film 360 by a given thickness by using a buffered oxide etchant (BOE) solution in which $NH_4F$ and HF are mixed in an adequate ratio, for example, 9:1, 100:1 or 300:1. At this time, if an EFH of the field oxide film 360 in the high-voltage transistor region HV is 50 to 200 Å and an EFH of the field oxide film 360 in the cell region CELL or the low-voltage transistor region LV is 300 to 800 Å, a field oxide film etch target is 200 to 600 Å. In other words, the field oxide film etch target is decided by variation in the EFH between the field oxide film 360 having a low EFH and the field oxide film 360 having a high EFH. For this reason, as shown in FIG. 10, the EFH of the field oxide film 360 in the cell region CELL and the low-voltage transistor region LV becomes same or similar as that of the field oxide film 360 in the high-voltage transistor HV.

A second step includes stripping the photoresist pattern 39 used as the etch mask while stripping organic contaminant generated in the process using the BOE solution in the first step, by using a PIRANHA cleaning solution in which $H_2SO_4$ and $H_2O_2$ are mixed. At this time, a temperature of the PIRANHA cleaning solution is 80 to 130° C.

A third step includes maximizing stripping of particles and organic contaminant left after the PIRANHA cleaning process in the second step, by using standard cleaning-1 (SC-1) solution in which $NH_4OH$, $H_2O_2$ and $H_2O$ are mixed in an adequate ratio, for example, 1:1:5 or 0.2:1:10. At this time, a temperature of the SC-1 cleaning solution is 40 to 200° C.

Figure 11:
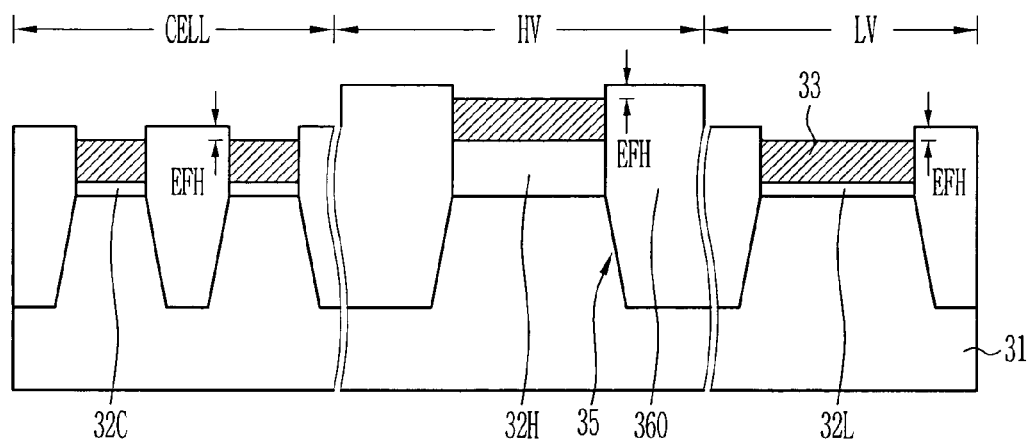

Referring to FIG. 11, the surface of the remaining nitride film 34 is pre-treated using an oxide etch solution to which HF is added. The remaining nitride film 34 is completely stripped in a solution to which $H_3PO_4$ is added. During the HF pre-treatment process and the nitride film strip process, the top of each of the field oxide films 360 formed in the regions CELL, HV and LV is lost at little. EFHs of the respective regions CELL, HV and LV are made to have the same lowered value.

Figure 12:
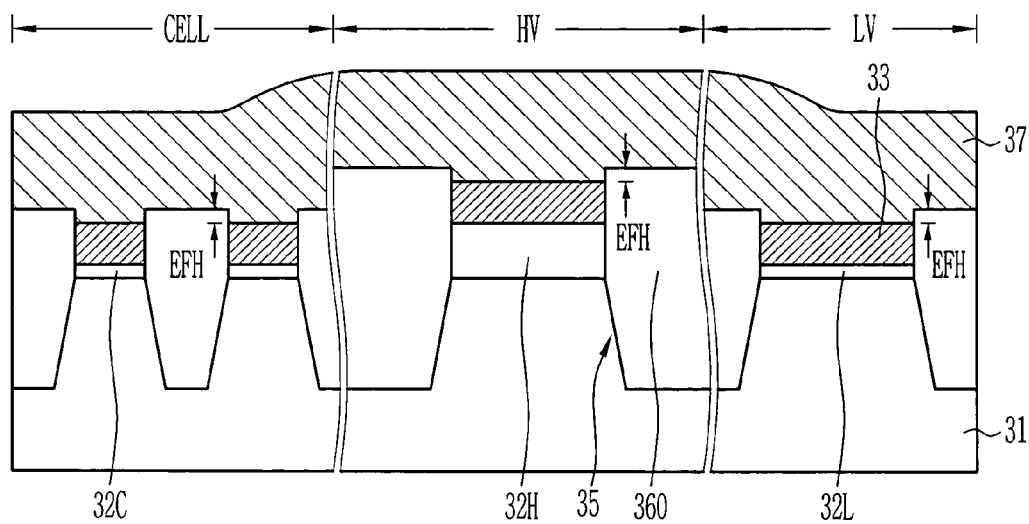

By reference to FIG. 12, a second polysilicon layer 37 for a floating gate is formed on the entire structure including the field oxide films 360 and the first polysilicon layer 33. Though not shown in the drawing, an etch process using a mask for a floating gate, a dielectric film formation process, a process of forming a conductive layer for a control gate, and an etch process using a mask for a control gate are performed to form gates in respective regions.

According to the present invention described above, EFH variation caused among a cell region, a high-voltage transistor region and a low-voltage transistor region due to a protrusion of a field oxide film of each of the regions is improved to facilitate setting of a subsequent gate etch target. Therefore, the present invention has effects that it can secure stability of a process and improve reliability of a device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory device, comprising:
   providing a semiconductor substrate in which a cell region, a high-voltage transistor region and a low-voltage transistor region are defined;
   forming gate oxide films in the high-voltage transistor, cell and low-voltage transistor regions where the gate oxide films in the high-voltage transistor region is thicker than the gate oxide films in the low-voltage transistor and cell regions;
   forming a first polysilicon layer on the gate oxide films and a nitride film on the first polysilicon layer;
   forming a plurality of trenches for isolating the respective regions;
   forming field oxide films in the trenches of the cell and the low-voltage transistor and high voltage transistor regions, wherein the cell and the low voltage transistor regions have a high EFH and the high voltage transistor region has a low EFH;
   forming a photoresist pattern on top of the nitride film and the field oxide films in the high-voltage transistor region that has the low EFH; and
   performing an etching process to etch selectively the field oxide films in the low-voltage transistor and cell regions having the high EFH to reduce differences in the EFHs of the high-voltage transistor region and the low-voltage transistor and cell regions by a given thickness using a BOE solution and the photoresist pattern as an etch mask thereby, the field oxide films of the cell and the low-voltage and high voltage transistor regions have a different height.

2. The method as claimed in claim 1, wherein the gate oxide films are a cell gate oxide film, a high-voltage gate oxide film and a low-voltage gate oxide film, and wherein the high-voltage gate oxide film has a thickness in the range of 300 to 500 Å, and each of the low-voltage gate and cell gate oxide films have a thickness of 100 Å or less.

3. The method as claimed in claim 1, wherein the field oxide films are formed by means of a self align shallow trench isolation (SA-STI) process.

4. The method as claimed in claim 1, further comprising:
   stripping the photoresist pattern and organic contaminant using a PIRANHA cleaning solution after etching the field oxide film having the high EFH ; and
   stripping particles and organic contaminant using a SC-1 cleaning, solution.

5. The method as claimed in claim 1, wherein the photoresist pattern is hardened by means of a descum process at a temperature in the range of 80° C. to 140° C.

6. The method as claimed in claim 1, wherein the BOE solution is a solution in which $NH_4 F$ and HF are mixed in a ratio of 9:1 or 300:1.

7. The method as claimed in claim 1, wherein a field oxide film etch target using the BOE solution is set according to variation in the EFH between the field oxide films having the low EFH and the field oxide films having the high EFH.

8. A method of manufacturing a flash memory device, comprising:
forming a cell gate oxide film, a high-voltage gate oxide film and a low-voltage gate oxide film on a semiconductor substrate in which a cell region, a high-voltage transistor region and a low-voltage transistor region are defined;
forming a first polysilicon layer and a nitride film on the gate oxide films; sequentially etching the nitride film, the first polysilicon layer, the gate oxide films and the semiconductor substrate to form a plurality of trenches for isolating the respective regions;
depositing an oxide film on the entire structure including the trenches and polishing the oxide film and the nitride film to a given thickness, whereby the field oxide films having a high EFH are formed in each of the cell, the low-voltage transistor regions and field oxide films having a low EFH are formed in the high-voltage transistor region;
stripping the nitride film that remains after the polishing process;
forming a photoresist pattern on top of the nitride film and the field oxide films in the high-voltage transistor region having the low EFH;
performing an etching process to etch selectively the field oxide films in the low-voltage transistor and cell regions having the high EFH to reduce differences in the EFHs of the high-voltage transistor region and the low-voltage transistor and cell regions by a given thickness using a BOE solution and the photoresist pattern as an etch mask thereby, the field oxide films of the cell and the low-voltage and high voltage transistor regions have a different height; and
forming a second polysilicon layer on the entire structure.

9. The method as claimed in claim 8, wherein the high-voltage gate oxide film is formed with a thickness in the range of 300 Å to 500 Å, each of the low-voltage gate oxide film and the cell gate oxide film is formed with a thickness of 100 Å or less, the first polysilicon layer is formed with a thickness in the range of 300 Å to 700 Å, and the nitride film is formed with a thickness in the range of 800 Å to 1200 Å.

10. The method as claimed in claim 8, wherein the stripping of the nitride film includes pre-treating the nitride film by using an oxide etch solution containing HF and stripping the nitride film by using a solution comprising $H_3 PO_4$.

11. The method as claimed in claim 8, further comprising:
stripping the photoresist pattern and organic contaminant using a PIRANHA cleaning solution after etching the field oxide films in the low-voltage transistor and cell regions; and
stripping particles and organic contaminant using a SC-1 cleaning solution.

12. The method as claimed in claim 8, wherein the photoresist pattern is hardened by means of a descum process at a temperature in the range of 80° C. to 140° C.

13. The method as claimed in claim 8, wherein the BOE solution is a solution in which $NH_4F$ and HF are mixed in a ratio of 9:1, or 300:1.

14. The method as claimed in claim 8, wherein a field oxide film etch target using the BOE solution is set by differences in EFHs between the field oxide films in the high-voltage transistor region and the field oxide films in the low-voltage transistor and cell regions.

15. A method of manufacturing a flash memory device, comprising: forming a cell gate oxide film, a high-voltage gate oxide film and a low-voltage gate oxide film on a semiconductor substrate in which a cell region, a high-voltage transistor region and a low-voltage transistor region are defined;
forming a first polysilicon layer and a nitride film on the gate oxide films;
sequentially etching the nitride film, the first polysilicon layer, the gate oxide films and the semiconductor substrate to form a plurality of trenches for isolating the respective regions;
depositing an oxide film on the entire structure and then polishing the oxide and nitride films to a given thickness, whereby field oxide films having a high EFH are formed in each of the cell and the low-voltage transistor regions and field oxide films having a low EFH are formed in the high-voltage transistor region;
forming a photoresist pattern on top of the nitride film and the field oxide films having the low EFH in the high 0 voltage transistor region; and
performing an etching process to etch selectively the field oxide films in the low-transistor and cell regions having the high EFHs to reduce differences in the EFHs of the high-voltage transistor region and the low-voltage transistor and cell regions by a given thickness using a BOE solution and the photoresist pattern as an etch mask thereby, the field oxide films of the cell and the low-voltage and high voltage transistor regions have a different height;
stripping the nitride film remaining after the polishing process; and
forming a second polysilicon layer on the entire srtucture.

16. The method as claimed in claim 15, wherein the high-voltage gate oxide films are formed with a thickness in the range of 300 Å to 500 Å, the low-voltage gate oxide film and the cell gate oxide film are formed with a thickness of 100 Å or less, the first polysilicon layer is formed with a thickness of 300 Å to 700 Å, and the nitride film is formed with a thickness in the range of 800 Å to 1200 Å.

17. The method as claimed in claim 15, wherein the process of stripping the remaining nitride film includes pre-treating the remaining nitride film by using an oxide etch solution containing HF and stripping the remaining nitride film by using a solution comprising $H_3 PO_4$.

18. The method as claimed in claim 15, further comprising:
stripping the photoresist pattern and organic contaminant using a PIRANHA cleaning solution after etching the field oxide film in the cell and the low-voltage transistor; and
stripping particles and organic contaminant using a SC-1 cleaning solution.

19. The method as claimed in claim 15, wherein the photoresist pattern is hardened by means of a descum process at a temperature in the range of 80□ to 140□.

20. The method as claimed in claim 15, wherein the BOE solution is a solution in which $NH_4F$ and HF are mixed in a ratio of 9:1 or 300:1.

21. The method as claimed in claim 15, wherein a field oxide film etch target using the BOE solution is set using differences in the EFHs between the field oxide films in the high-voltage transistor region and the field oxide films in the low-voltage transistor and cell regions.

* * * * *

UNITED STATES PATENT AND TRADEMARK OFFICE
CERTIFICATE OF CORRECTION

| | | |
|---|---|---|
| PATENT NO. | : 7,211,484 B2 | Page 1 of 1 |
| APPLICATION NO. | : 10/745008 | |
| DATED | : May 1, 2007 | |
| INVENTOR(S) | : Seung C. Lee et al. | |

It is certified that error appears in the above-identified patent and that said Letters Patent is hereby corrected as shown below:

On the Title Page:

ITEM (74), "Borun" should be -- Borun LLP --.

In the Claims:

At Column 8, line 18, "region is thicker" should be -- region are thicker --.

At Column 8, line 56, "cleaning, solution" should be -- cleaning solution --.

At Column 8, line 61, "$NH_4$ F" should be -- $NH_4F$ --.

At Column 8, line 62, "9:1 or 300:1" should be -- 9:1, 100:1 or 300:1 --.

At Column 9, line 59, "9:1, or 300:1" should be -- 9:1, 100:1 or 300:1 --.

At Column 10, line 17, "high0voltage" should be -- high-voltage --.

At Column 10, line 30, "srtucture" should be -- structure --.

At Column 10, line 42, "$H_3$ $PO_4$" should be -- $H_3PO_4$ --.

At Column 10, line 53, "80☐to 140☐" should be -- 80° C. to 140° C.--.

At Column 10, line 56, "9:1 or 300:1" should be -- 9:1, 100:1 or 300:1 --.

Signed and Sealed this

Fourth Day of December, 2007

JON W. DUDAS
*Director of the United States Patent and Trademark Office*